United States Patent [19]

Ikeda et al.

[11] Patent Number: 4,705,700
[45] Date of Patent: Nov. 10, 1987

[54] CHEMICAL VAPOR DEPOSITION METHOD FOR THE THIN FILM OF SEMICONDUCTOR

[75] Inventors: Masakiyo Ikeda, Yokohama; Seiji Kojima; Hiroshi Kikuchi, both of Tokyo; Yuzo Kashiwayanagi, Yokosuka, all of Japan

[73] Assignee: The Furukawa Electric Co., Ltd., Tokyo, Japan

[21] Appl. No.: 868,060

[22] Filed: May 29, 1986

[30] Foreign Application Priority Data

May 31, 1985 [JP] Japan .................................. 60-118378

[51] Int. Cl.$^4$ ........................................... H01L 21/205
[52] U.S. Cl. .................................... 437/231; 118/500; 118/730; 156/613
[58] Field of Search ................ 118/500, 730; 156/613; 427/82, 86, 87, 95

[56] References Cited

U.S. PATENT DOCUMENTS

| | | | |
|---|---|---|---|
| 3,633,537 | 1/1972 | Howe ................................... | 118/500 |
| 4,275,282 | 6/1981 | Miller ................................... | 118/730 |
| 4,322,592 | 3/1982 | Martin .................................. | 118/730 |
| 4,579,080 | 4/1986 | Martin .................................. | 118/730 |
| 4,588,451 | 5/1986 | Vernon .................................. | 156/613 |
| 4,596,208 | 6/1986 | Wolfson ................................ | 118/730 |

*Primary Examiner*—John D. Smith
*Attorney, Agent, or Firm*—Oblon, Fisher, Spivak, McClelland, & Maier

[57] ABSTRACT

A chemical vapor deposition method for making a semiconductor thin film is disclosed, which is characterized in that, in the method wherein semiconductor thin films are allowed to deposit onto the substrates by allowing the susceptor in the shape of polygonal frustum fitted with a plurality of semicondutor substrates to the side faces thereof to rotate in the vertical type reaction tube, by introducing the source gases and the carrier gas into the tube, and by heating the substrates to allow the source gases to react through thermal decomposition, the number of rotations of susceptor is varied in terms of rectangular wave function, trapezoidal wave function or sine wave function and the susceptor is allowed to rotate in converse directions depending on the positive region and the negative region of the function.

9 Claims, 9 Drawing Figures

FIG. 2
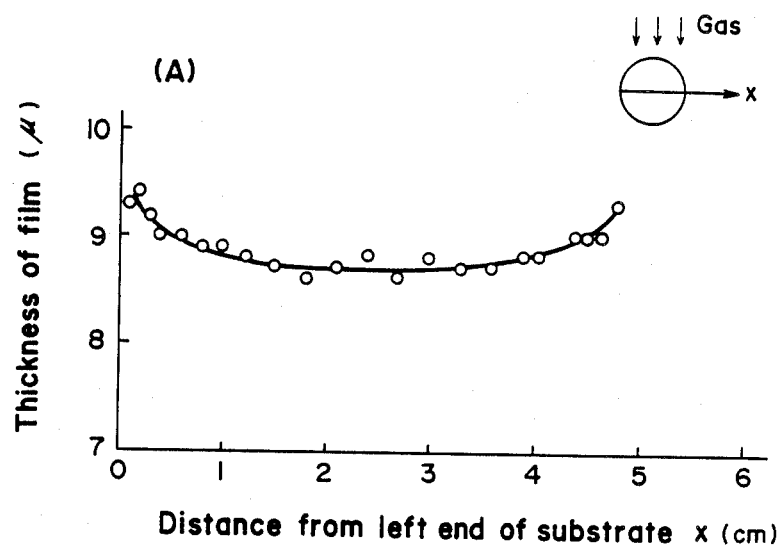
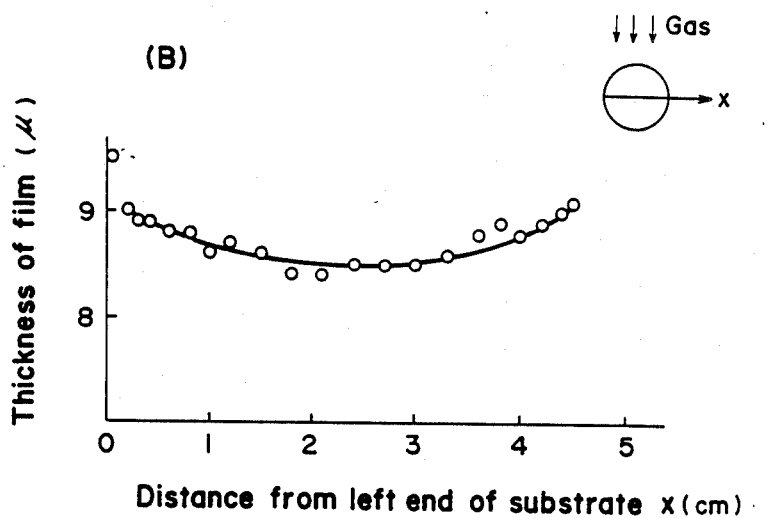

F I G . 3
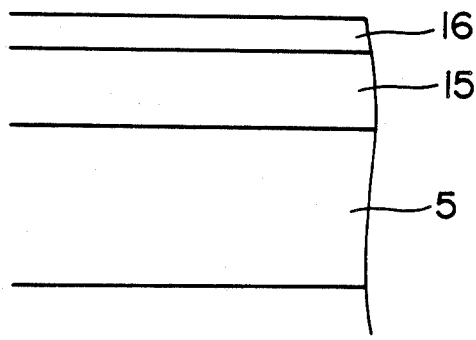

CHEMICAL VAPOR DEPOSITION METHOD FOR THE THIN FILM OF SEMICONDUCTOR

BACKGROUND OF THE INVENTION

1. Field of the Invention

The present invention relates to a chemical vapor deposition method for making a semiconductor thin film, by which the uniformity of thin films allowed to deposit from vapor phase simultaneously onto a plurality of substrates is improved particularly between the substrates and inside the substrate.

2. Discussion of Background

Generally, in the chemical vapor deposition method for the thin film of semiconductor, as shown in FIG. 4, a gas introductory port (2) and a gas exhaust port (3) are provided at the upper portion and the lower portion of a vertical type cylindrical reaction tube (1), respectively, a plurality of semiconductor substrates (5) are fitted onto the side faces of carbon susceptor (4) in the shape of polygonal frustum provided coaxially in the reaction tube (1), and the source gases and the carrier gas are introduced from the gas introductory port (2) at the upper portion to be flowed downwards and ejected from the exhaust port (3) at the lower portion. In this way, the substrates (5) are heated to a predetermined temperature to allow the source gases near the substrates (5) to react through thermal decomposition and the thin films of semiconductor are allowed to deposit onto the substrates (5).

The substrates (5) are subjected to high-frequency heating by providing an RF coil (6) around the outer circumference of the reaction tube (1) and, in order to prevent the thermal decomposition of source gases except near the surface of the substrates (5), the reaction tube (1) is made of a double quartz wall forming a jacket (7) having a refrigerant inductory port (8) and a refrigerant exhaust port (9) and the refrigerant is flowed into this jacket (7) to cool the reaction tube (1). Moreover, in order to make the thickness of the deposited semiconductor thin film uniform by averaging the discrepancy in the geometrical symmetry between the susceptor (4) and the reaction tube (1) and the discrepancy in the geometrical symmetry of the exhaust port (3), a rotational axis (10) is provided to the susceptor (4) to allow the susceptor (4) to rotate at a constant number of rotations. Besides, in the diagram, the numeral (11) indicates a preparation chamber to exchange the substrates (5) having allowed the thin films of semiconductor to deposit, (12) indicates a gate valve, (13) indicates a hydrogen introductory port, and (14) indicates a frange of substrate loading.

In the conventional chemical vapor deposition method, although the variation in the thin films deposited may be improved considerably between the substrates by allowing the susceptor to rotate at a constant number of rotations, there is a shortcoming that the variation in the thin film in the direction perpendicular to the flow of gas is large in the substrate. FIGS. 5 (A) and (B) show the variations in the thickness of thin films deposited by the conventional chemical vapor deposition method described above in the direction perpendicular to the flow of gas, wherein (A) shows the case of clockwise rotation and (B) shows that of counter-clockwise rotation. It can be seen that the variations in the thickness of film are large in all cases. Moreover, this dispersion becomes more remarkable as the number of rotations of susceptor increases.

SUMMARY OF THE INVENTION

As a result of various investigations in view of the above described situation, a chemical vapor deposition method for making semiconductor thin films has been developed, which makes it possible to improve the uniformity of thin films allowed to deposit from vapor phase simultaneously onto a plurality of substrates between the substrates and in the substrate. Namely, the invention is characterized in that, it provides a method wherein semiconductor thin films are allowed to deposit onto the substrates by allowing the susceptor in the shape of a frustrum fitted with a plurality of semiconductor substrates to the side faces thereof to rotate in a vertical type reaction tube, by introducing the source gases and the carrier gas into the tube, and by heating the substrates to allow the source gases to decompose, the rotation of the susceptor is varied in terms of rectangular wave function, trapezoidal wave function or sine wave function and the susceptor is allowwed to rotate in converse directions depending on the positive region and the negative region of the function.

BRIEF DESCRIPTION OF THE FIGURES

FIGS. 2 (A) and (B) show the variations in the thickness of thin films allowed to deposit from vapor phase according to the invention in the direction perpendicular to the flow of gas, wherein (A) is the case varied the rotation of susceptor in terms of rectangular wave functions and (B) is the case varied the rotation of susceptor in terms of trapezoidal wave function.

FIG. 3 is a cross section showing one example allowed the buffer layer and the active layer to deposit in two layers onto the substrate.

FIG. 4, 1 is a reaction tube, 2 is a gas introductory port, 3 is a gas exhaust port, 4 is a susceptor, 5 is a substrate, 15 is a buffer layer, 16 is an active layer, 6 is a RF coil, 7 is a cooling jacket, and 10 is a rotational axis.

DETAILED DESCRIPTION OF THE PREFERRED EMBODIMENT

Figure 1:
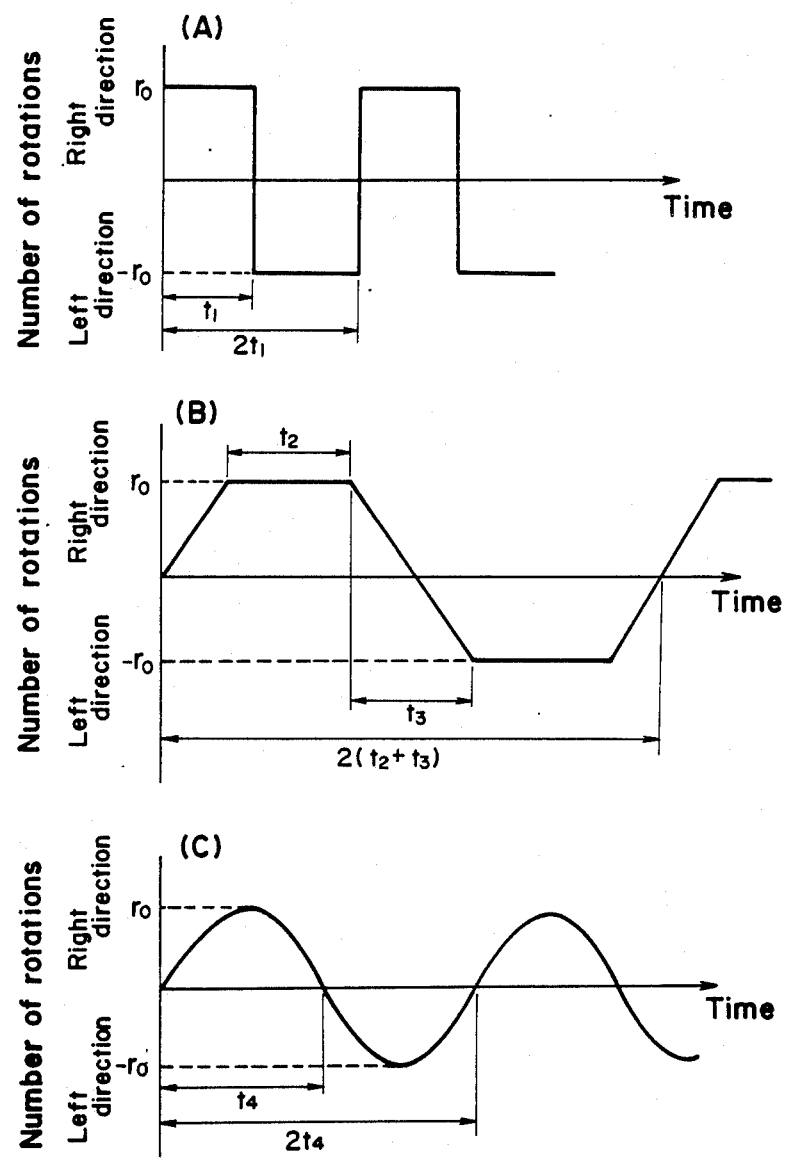
FIGS. 1 (A), (B) and (C) show the rotations in the invention, wherein (A) is a rotation in terms of rectangular wave function, (B) is a rotation in terms of trapezoidal wave function and (C) is a rotation in terms of sine wave function.
Figure 4:
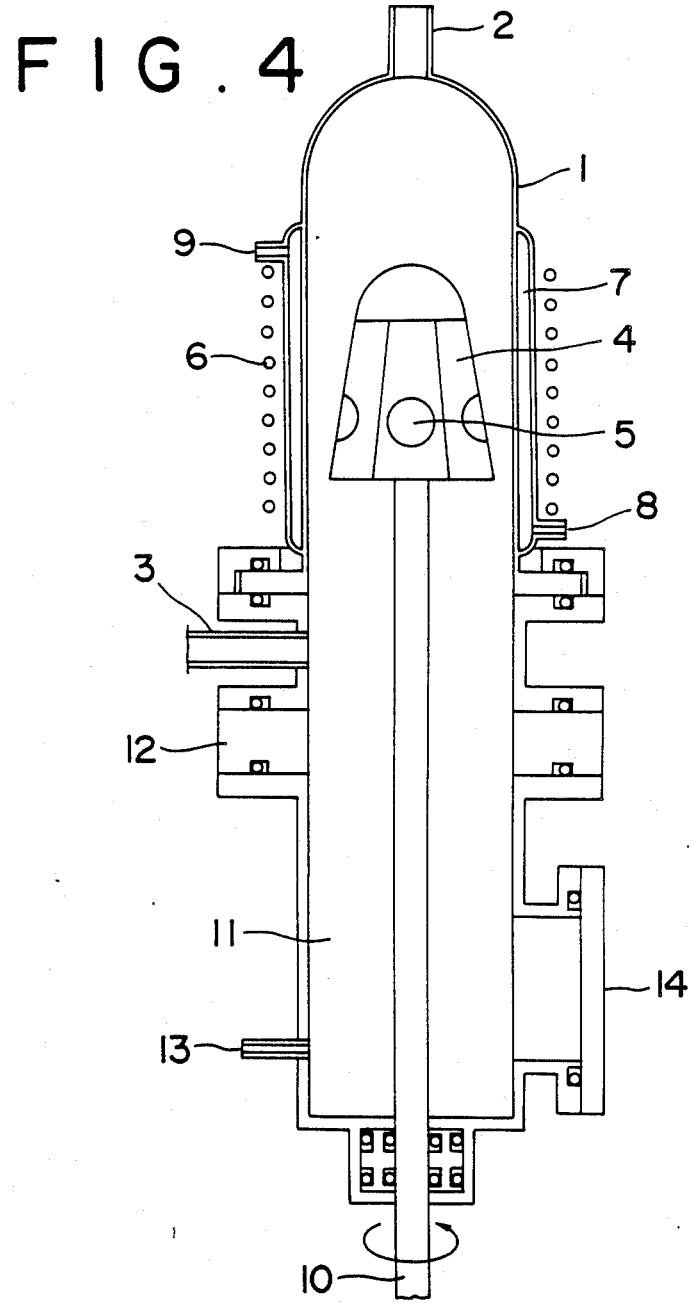
FIG. 4 is an illustration diagram showing one example of the chemical vapor disposition apparatus.

In the invention, a plurality of semiconductor substrates are fitted to the side faces of susceptor in the shape of a frustrum provided coaxially in the vertical type reaction tube shown in FIG. 4 and the source gases and the carrier gas are introduced from the upper portion into the reaction tube to be flowed downwards and ejected from the exhaust port at the lower portion. In this way, the rotation of the susceptor is varied in terms of rectangular wave function shown in FIG. 1 (A), trapezoidal wave function shown in FIG. 1 (B) or sine wave function shown in FIG. 1 (C), and the susceptor is allowed to rotate in converse rotational directions depending on the positive region and the negative region of the function, for example, in clockwise rotation at the time of positive region and in counter-clockwise at the time of negative region as shown in FIGS. 1 (A), (B) and (C). Then, the substrates fitted to the susceptor are heated to allow the thin films of semiconductor to deposit onto the substrates.

Figure 5:
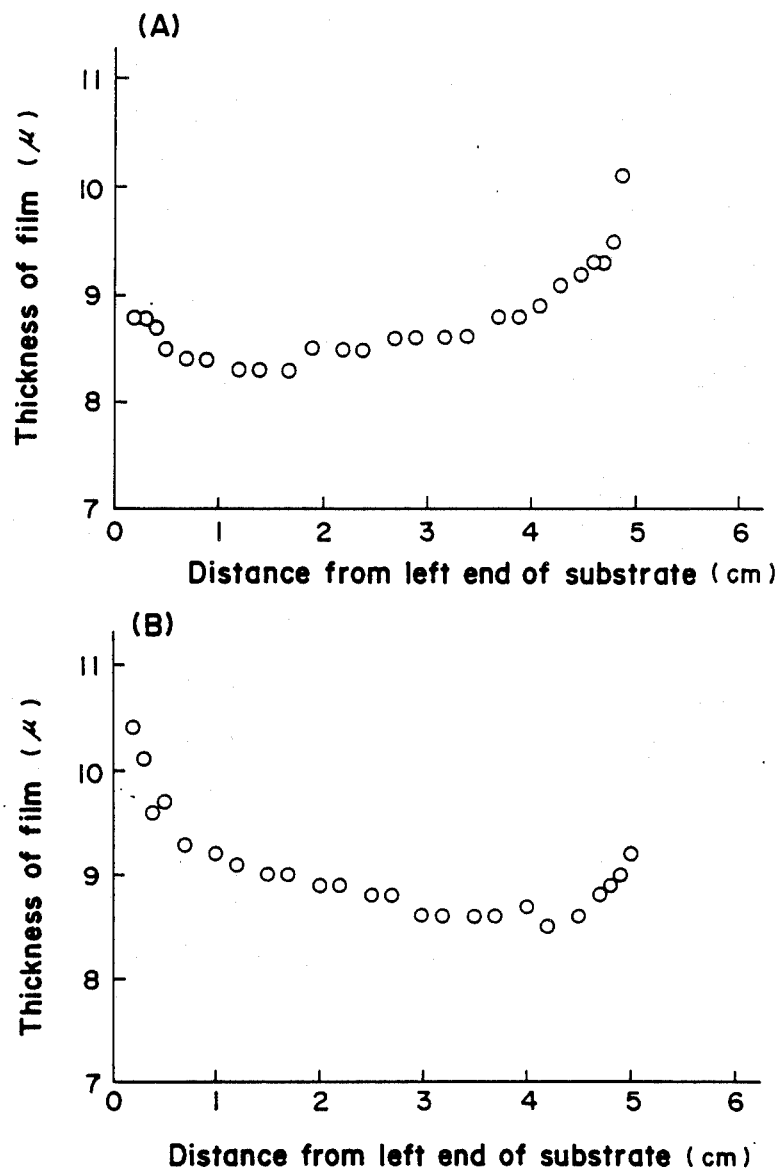
FIG. 5 shows the variations in the thickness of thin films allowed to deposit from vapor phase conventionally in the direction perpendicular to the flow of gas. In FIG. 3

When the direction of the rotation of susceptor is varied to the converse rotational directions at the time of the chemical vapor deposition, the uniformity in the thickness of film takes a state superposed the variation in the thickness of film in case of clockwise rotation shown in FIG. 5 (A) and that in case of counter-clockwise rotation shown in FIG. 5 (B), and, in particular, the uniformity in the central region excepting the end portions can be improved significantly. According to the invention, the rotation is varied in terms of rectangular wave function, trapezoidal wave function or sine wave function as shown in FIGS. 1 (A), (B) and (C) and the susceptor is allowed to rotate in converse directions depending on the positive region and the negative region of the function. Therefore, the uniformity of the thin film allowed to deposit from vapor phase onto the substrate can be improved still more inside the substrate.

In FIGS. 1 (A), (B) and (C), the time constants ($t_1$–$t_4$) and the speed of rotation ($r_o$) shown in the diagrams are determined depending on the thickness of the thin film of semiconductor deposited and the deposition rate. However, the speed of rotation $r_o$ is to be selected from the conditions under which the variation in the thickness of thin film becomes less than ±10% when the direction of rotation is made constant. This is in a range of 3 to 10 rpm ordinarily in our case. Moreover, if the sum of the number of rotations $n_1, n_2, \ldots n_i$ of susceptor in respective positive regions of the function is N times and the sum of the number of converse rotations $k_1, k_2, \ldots k_l$ of susceptor in respective negative regions of the function is K times, it is necessary to make N=K, and the time for the deposition of thin film of semiconductor is made equal to the cycle of rectangular wave function, trapezoidal wave function or sine wave function multiplied by the integer.

EXAMPLE 1

Employing the chemical vapor deposition apparatus shown in FIG. 4 and using $AsH_3$ and $Ga(CH_3)_3$ for the source gases, the supplying ratio (V/III) thereof being at a rate of about 15, the rotations of susceptor were varied in terms of rectangular wave function shown in FIG. 1 (A) and in terms of trapezoidal wave function shown in FIG. 1 (B), respectively, and the GaAs substrates having a diameter of 50 mm were heated to 650° C. to allow the GaAs thin films of semiconductor to deposit from vapor phase onto the substrates.

Besides, the variation in terms of rectangular wave function is not desirable since the flow of gas is disturbed by the abrupt turning over of the rotational direction, but there is no difficulty if the time to be disturbed is shorter compared with the time of deposition. For this reason, it is desirable for $t_1$ to make longer than 60 seconds in the case of rectangular wave function shown in FIG. 1 (A).

In this example of the invention, the variations of susceptor in terms of rectangular wave function and trapezoidal wave function were conducted under following conditions.

|  | Rectangular wave function | Trapezoidal wave function |
|---|---|---|
| Deposition rate (μ/min) | 0.087 | 0.087 |
| Thickness (μ) | 8.7 | 8.7 |
| Deposition time (min) | 100 | 100 |
| Time constant (min) | $t_1 = 10$ | $t_2 = 9$ |
|  |  | $t_3 = 1$ |
| Speed of rotation (rpm) | $r_o = 6$ | $r_o = 6$ |
| Number of rotations per a cycle (times) | 120 | 114 |
| Number of cycles | 5 | 5 |
| Total number of rotations | 600 | 570 |

Of the thin films thus obtained, the thickness of film in the direction perpendicular to the flow of gas was examined. Results are shown in FIGS. 2 (A) and (B).

FIG. 2 (A) shows the variation in the thickness of film in the case of susceptor being varied in terms of rectangular wave function and FIG. 2 (B) shows that in the case of susceptor being varied in terms of trapezoidal wave function. As evident from the comparison with FIGS. 5 (A) and (B), it can be seen that the dispersion in the thickness of film at the central portion of 40 mm excepting the periphery of 5 mm is about ±6% by the conventional method, whereas it is improved to less than ±3% in accordance with the invention.

EXAMPLE 2

Similarly to Example 1, the rotations of susceptor were varied in terms of rectangular wave function, trapezoidal wave function and sine wave function as shown in FIGS. 1 (A), (B) and (C), respectively, and, by allowing the buffer layer to deposit under the conditions shown in Table 1 through Table 3 and, in succession, by allowing the active layer to deposit under the conditions shown in Table 1 through Table 3 after the addition of $H_2S$ gas to source gases, the thin films of semiconductor consisting of double layer structure of buffer layer (15) and active layer (16) were allowed to deposit from vapor phase onto the substrates (5) as shown in FIG. 3.

Of the thin films obtained in this way, the thickness of film in the direction perpendicular to the flow of gas and the distribution of the carrier concentration inside the face of active layer were examined. As a result, the variations in the thickness of film were less than ±3%, the distributions of the carrier concentration inside the face were uniform as indicated within ±5%, and the fluctuations of the carrier concentration in the direction of depth were not recognized in all cases.

TABLE 1

| (Variation in terms of rectangular wave function) | | |
|---|---|---|
|  | Buffer layer | Active layer |
| Deposition rate (μ/min) | 0.06 | 0.06 |
| Thickness (μ) | 3 | 0.3 |
| Deposition time (min) | 50 | 5 |
| Time constant (min) | $t_1 = 5.0$ | $t_1 = 2.5$ |
| Number of rotations (rpm) | $r_o = 6$ | $r_o = 6$ |
| Number of rotations per a cycle (times) | 60 | 30 |
| Number of cycles | 5 | 1 |
| Total number of rotations (times) | 300 | 30 |

TABLE 2

(Variation in terms of trapezoidal wave function)

| | Buffer layer | Active layer |
|---|---|---|
| Deposition rate ($\mu$/min) | 0.06 | 0.06 |
| Thickness ($\mu$) | 3 | 0.3 |
| Deposition time (min) | 50 | 5 |
| Time constant (min) | $t_2 = 4.0$ | $t_2 = 1.5$ |
| | $t_3 = 1.0$ | $t_3 = 1.0$ |
| Number of rotations (rpm) | $r_o = 6$ | $r_o = 6$ |
| Number of rotations per a cycle (times) | 54 | 24 |
| Number of cycles | 5 | 1 |
| Total number of rotations (times) | 270 | 24 |

TABLE 3

(Variation in terms of sine wave function)

| | Buffer layer | Active layer |
|---|---|---|
| Deposition rate ($\mu$/min) | 0.06 | 0.06 |
| Thickness ($\mu$) | 3 | 0.3 |
| Deposition time (min) | 50 | 5 |
| Time constant (min) | $t_4 = 5$ | $t_4 = 5$ |
| Number of rotations (rpm) | 5 | 5 |
| Number of rotations per a cycle (times) | 16 | 16 |
| Number of cycles | 10 | 1 |
| Total number of rotations (times) | 160 | 16 |

As described above, according to the invention, the discrepancy in the geometrical symmetry is averaged between the reaction tube and the susceptor and, at the same time, the uniformity of thin films allowed to deposit from vapor phase onto a plurality of substrates can be improved remarkably between the substrates and inside the substrate. Therefore, the invention exerts a conspicuous effect industrially.

What is claimed is:

1. A method for making a semiconductor film by chemical vapor deposition, comprising allowing a semiconductor thin film to deposit onto a semiconductor substrate fitted onto a susceptor having the shape of a frustum, wherein the said susceptor is fitted with a plurality of the said semiconductor substrate onto its side faces and the said susceptor is rotating in a vertical-type reaction tube, wherein source gases and a carrier gas are introduced into the said tube and the said substrates are heated to promote the thermal decomposition of the said source gases, wherein the number of rotations of the said susceptor is varied in terms of a rectangular wave function, a trapezoidal wave function, or a sine wave function and wherein the said susceptor is allowed to rotate in a converse direction depending on the positive region and the negative region of the said function.

2. The method of claim 1, comprising using a deposition time which is equal to the cycle of the said rectangular wave function, trapezoidal wave function, or sine wave function, multiplied by an interger.

3. The method of claim 1, comprising using a number of rotations of the said susceptor in the positive regions of the said function equal to the number of converse rotations of the said susceptor in the negative regions of the said function.

4. The method of claim 1, comprising using a number of rotations of the said susceptor in the positive regions of the said function equal to the number of converse rotations of the susceptor in the negative regions of the said function.

5. The method of claim 1, comprising using a rectangular wave function.

6. The method of claim 1, comprising using a trapezoidal wave function.

7. The method of claim 1, comprising using a sine wave function.

8. The method of claim 1, comprising using a speed of rotation providing a thin film in which variation of the thickness of the said thin film is less than ±10%, when the direction of the said rotation is made constant.

9. The method of claim 1, comprising using a speed of rotation of from 3 to 10 rpm.

* * * * *